(12) United States Patent
Lee et al.

(10) Patent No.: US 8,701,055 B1
(45) Date of Patent: Apr. 15, 2014

(54) MACRO CELL BASED PROCESS DESIGN KIT FOR ADVANCED APPLICATIONS

(71) Applicant: Taiwan Semiconductor Manufacturing Co., Ltd., Hsin-Chu (TW)

(72) Inventors: Hui Yu Lee, Hsin-Chu (TW); Chi-Wen Chang, Yuanlin Township (TW); Jui-Feng Kuan, Zhubei (TW); Wen-Shen Chou, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/707,714

(22) Filed: Dec. 7, 2012

(51) Int. Cl.
*G06F 17/50* (2006.01)

(52) U.S. Cl.
USPC .............. 716/54; 716/56; 716/122; 716/132

(58) Field of Classification Search
USPC ...................... 716/54, 56, 122, 132
See application file for complete search history.

(56) References Cited

U.S. PATENT DOCUMENTS

| | | | | |
|---|---|---|---|---|
| 6,321,367 B1* | 11/2001 | Chun et al. | ...... | 716/55 |
| 6,795,952 B1* | 9/2004 | Stine et al. | ...... | 716/56 |
| 6,968,524 B2* | 11/2005 | Jiang et al. | ...... | 716/123 |
| 7,808,051 B2* | 10/2010 | Hou et al. | ...... | 257/368 |
| 8,024,675 B1* | 9/2011 | Gupta et al. | ...... | 716/54 |
| 8,141,016 B2* | 3/2012 | Correale et al. | ...... | 716/111 |
| 8,332,794 B2* | 12/2012 | Law et al. | ...... | 716/116 |
| 2011/0082680 A1* | 4/2011 | Chang et al. | ...... | 703/14 |
| 2012/0144361 A1* | 6/2012 | Cheng et al. | ...... | 716/132 |
| 2012/0204135 A1* | 8/2012 | Chung | ...... | 716/53 |

* cited by examiner

*Primary Examiner* — Naum Levin
(74) *Attorney, Agent, or Firm* — Duane Morris LLP

(57) ABSTRACT

The present disclosure provides a system and method of designing an integrated circuit. A plurality of devices are selected and properties assigned to each of the plurality of devices. These plural devices having assigned properties are then combined into a macro cell whereby a density gradient pattern is generated for the macro cell. Layout dependent effect (LDE) parameters are determined for the macro cell as a function of the combination of plural devices, and electrical performance characteristics for the macro cell are simulated. A layout distribution of the plurality of devices within the macro cell can then be determined as a function of one or more of the simulated electrical performance characteristics, determined LDE parameters, and generated density gradient pattern. A design layout of an integrated circuit can be generated corresponding to the layout distribution for the macro cell.

20 Claims, 16 Drawing Sheets

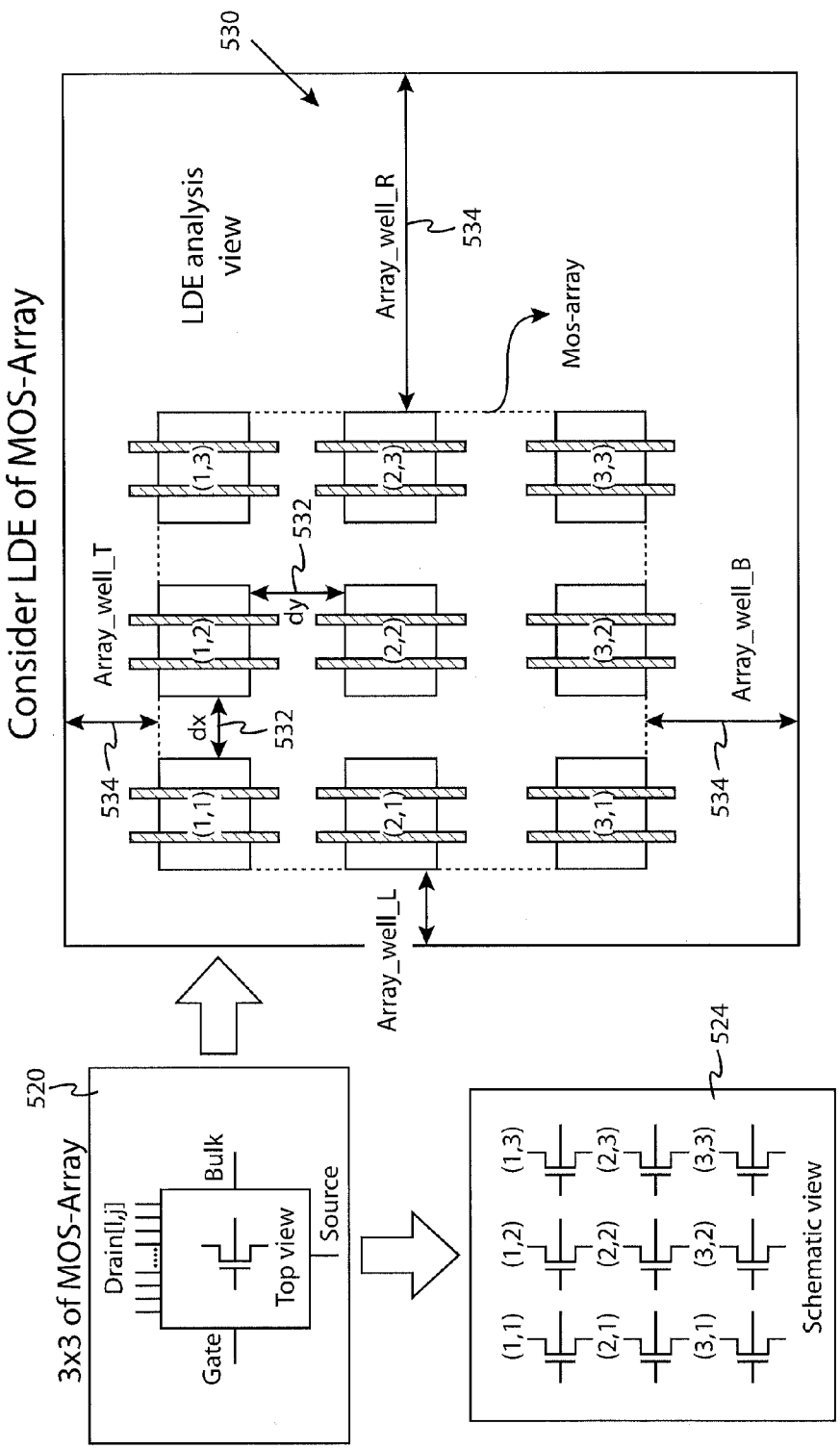

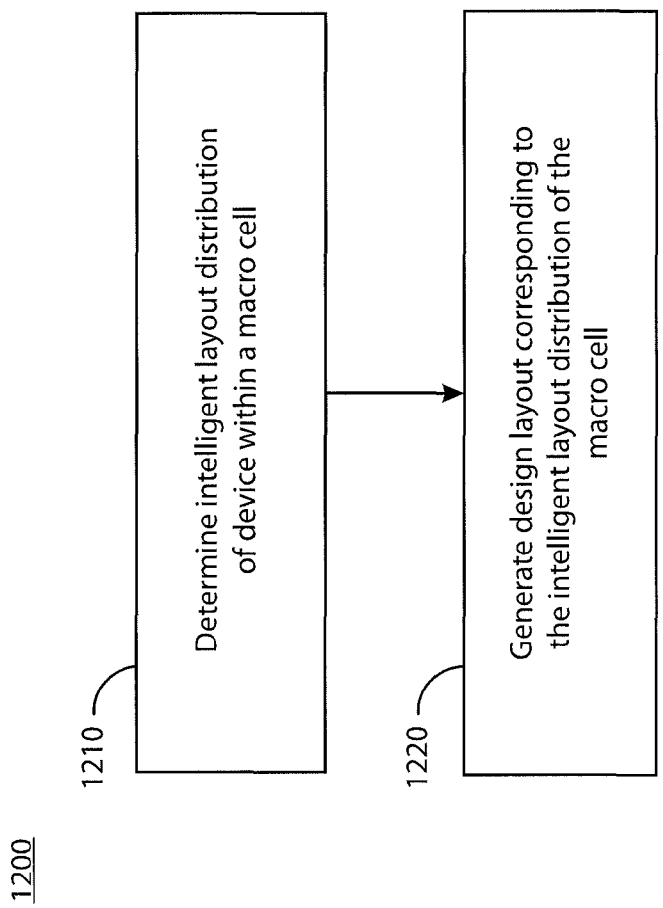

_US 8,701,055 B1_

MACRO CELL BASED PROCESS DESIGN KIT FOR ADVANCED APPLICATIONS

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, allowing for the integration of more components into a given area.

While features of integrated circuits (ICs) shrink, modeling the impact of physical and layout effects in IC designs is needed. For example, process design kits (PDKs) or process access kits (PAKs) have been commercially employed to build up ICs in efforts to increase density on a wafer and model locations of components on the wafer. Generally, PDKs include geometric descriptions and models of devices, such as transistors, diodes, resistors, capacitors, etc. Conventionally, circuit design engineers translate PDKs to transistor netlists and/or gate-level netlists for circuit simulations. Based upon the simulation results, circuit design engineers can then predict and/or modify the designs of the ICs.

In advanced processes such as, but not limited to, a 28 nanometer (N28) process, a 20 nanometer (N20) process, and the like, device performance is impacted by physical layout structure and surrounding environment effects such as a density gradient, edge and layout dependent effects. Conventionally, these layout related impacts are guessed or estimated in the simulation phase prior to actual layout of circuitry.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

FIGS. 5A-5C are simplified diagrams of certain macro cell analyses for an embodiment of the present subject matter.

FIG. 12 is a block diagram of another embodiment of the present subject matter.

DETAILED DESCRIPTION

Figure 1:
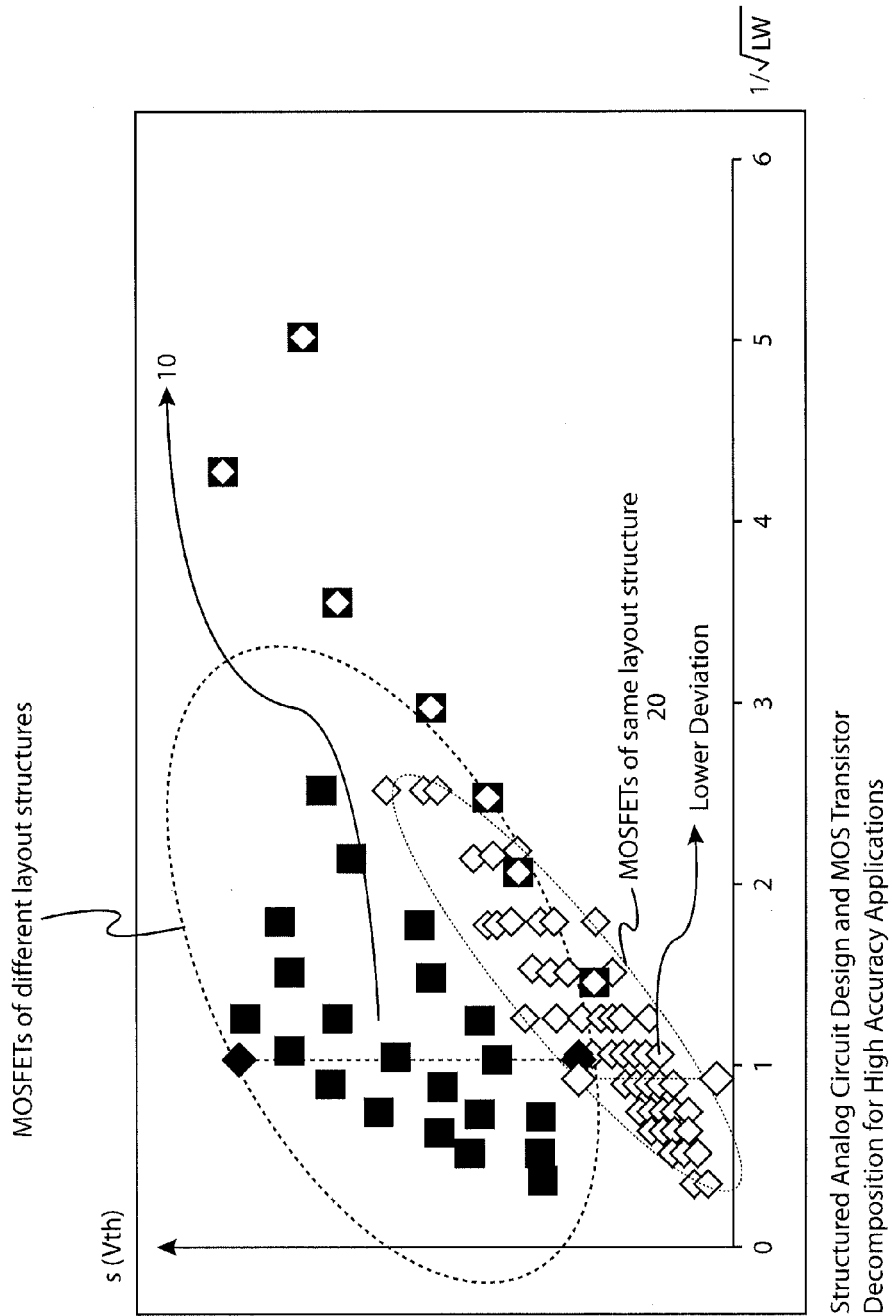
FIG. 1 is a plot of threshold voltage (Vth) versus the dimensions of a metal-oxide-semiconductor field effect transistor ($1/\sqrt{(LW)}$).

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below".

Generally, a process design kit (PDK) includes an intellectual property (IP) library. The IP library can include process models and design kits in appropriate technology file formats for use by circuit designers. The PDK is used to perform various simulations of integrated circuits (ICs) up front prior to actual layout and/or manufacture. In some embodiments, an exemplary PDK provides a macro-cell library to assist in determining layout related impacts in an advanced process technology such as, but not limited to, layout dependent effects (LDE), well proximity effects (WPE), poly-spacing effects (PSE), length of diffusion (LOD), OD to OD spacing effects (OSE), layout patterning check (LPC), OD poly density (OP/PO Density), parasitics, mismatch, density, pre-coloring, and other effects. An exemplary PDK according to embodiments of the present subject matter can transfer physical layout geometries into a simulation of a respective circuit and can mitigate differences between physical layout topology and simulation conditions thereby reducing any re-spin efforts and boosting design productivity.

Figure 2:
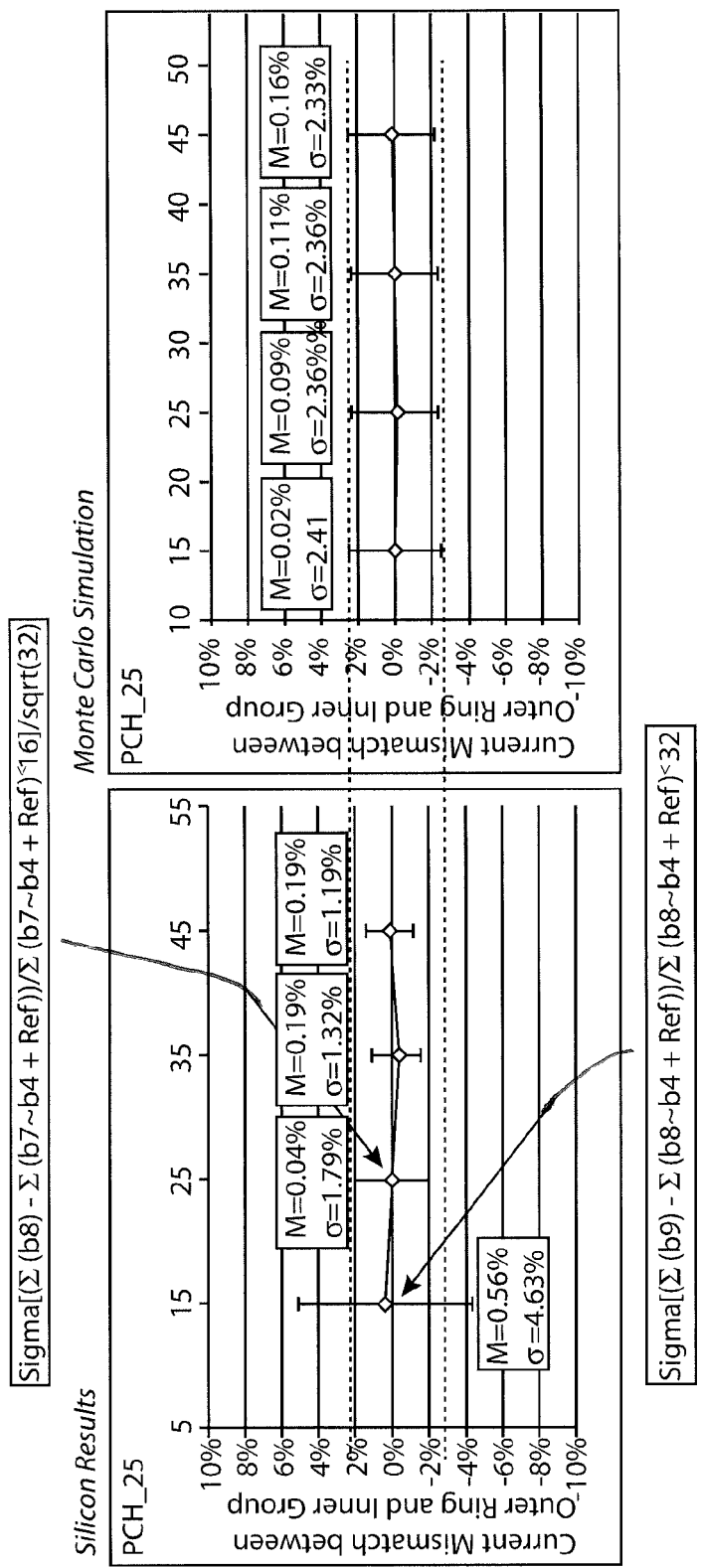
FIG. 2 is a plot of current mismatch versus width in micrometers showing the variation between devices in an outer cell of a wafer and the devices in an inner group or cell of the wafer.

For example, a metal-oxide-semiconductor field effect transistor (MOSFET) can be designed with four terminals coupled to the source, drain, gate, and bulk of the MOSFET. The PDK has the information associated with the four terminals; however, because of layout related impacts, different layout structures will cause different variations and deviations for such impacts. FIG. 1 is a plot of threshold voltage (Vth) versus the dimensions of MOSFETs ($1/\sqrt{(LW)}$). With reference to FIG. 1, if the MOSFETs have different layout structures 10 with a large length and width, greater variations and deviations in the threshold voltage of these devices are encountered than in the case if the MOSFETs have the same or similar layout structures 20. Furthermore, using a chemical mechanical planarization (CMP) process in a high-k metal gate, the edge and center cells of an exemplary arrangement will possess three times or more variation in the respective devices as illustrated in FIG. 2. FIG. 2 is a plot of current mismatch versus width in micrometers showing variations between devices in an outer cell of a wafer and the devices in an inner group or cell of the wafer. Thus, traditional PDK processes and their respective design flow are lacking.

Figure 3:
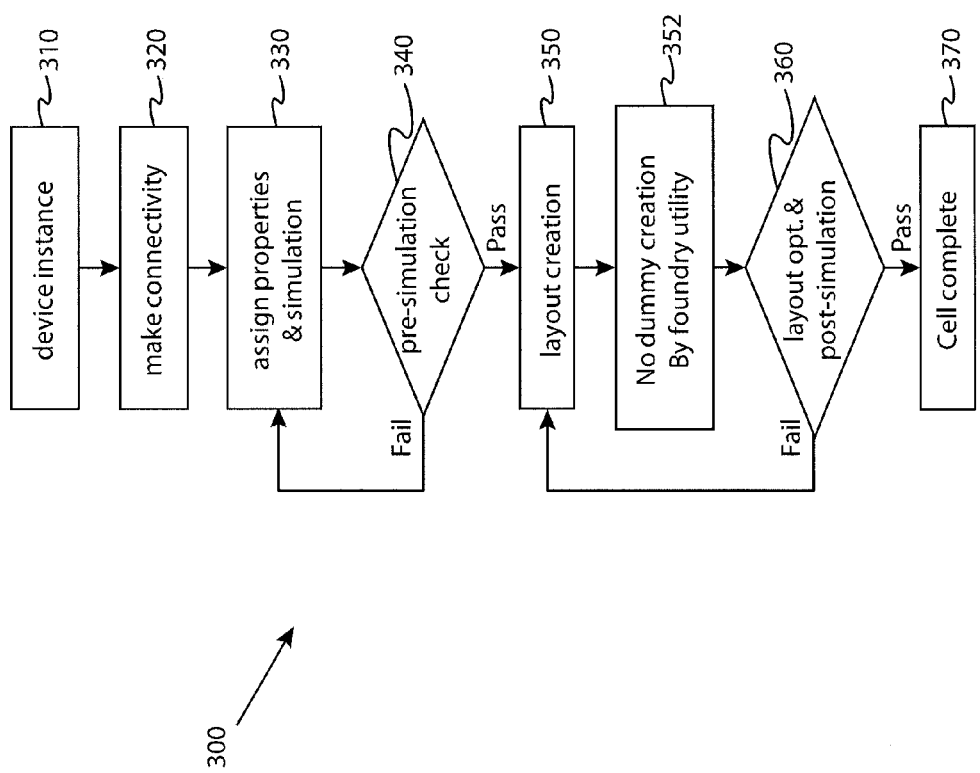
FIG. 3 is a block diagram of a traditional process design kit design flow.

FIG. 3 is a block diagram of a traditional PDK design flow. With reference to FIG. 3, a traditional PDK method 300 includes at step 310 identifying a device to be used and making connectivity thereto at step 320 to run a simulation. At step 330, certain properties can be assigned and a pre-layout simulation performed on a pre-layout simulator, such as HSPICE® commercially available from Synopsys, Inc. (San Jose, Calif.), SPECTRE® commercially available from Cadence Design Systems, Inc. (San Jose, Calif.), or any commercially available pre-layout simulator. This pre-layout simulation is usually performed using information generated from a PDK file. Upon completion of the simulation, a designer can determine if certain layout checks have passed or failed (e.g., behavior check, function check, etc.) at step 340. If the simulation checks pass, then a respective designer moves to a layout creation stage at step 350 whereby a design layout is generated, else the designer proceeds back to step 330 and re-assigns properties and performs additional pre-layout simulations. Generally, a design layout can be generated as a Graphic Database System (GDS) file (e.g., a GDSII file) and includes a database file comprising various layers that are drawn to represent an IC. This step can include generating a dummy layout by the foundry at step 352; however, the step of generating a design layout can correspond to the simulation result of the pre-layout simulation. For example, if the pre-layout simulation passes a behavior check and/or function check, minimum rules and/or large attributes of the devices can generally be used to generate a design layout for an IC. This step of generating the design layout can be performed on a platform, such as VIRTUOSO® commercially available from Cadence Design Systems, Inc. (San Jose, Calif.). After layout creation, a post-layout simulation can be performed at step 360. Generally, this step can be performed on a post-layout simulator, such as HSPICE®, SPECTRE®, or another commercially-available post-layout simulator. If this post-layout simulation passes certain checks (e.g., layout-versus-schematic (LVS) checks, etc.), then the cell is complete at step 370 and manufacturing can commence, else the designer proceeds back to step 350 and proceeds with another design layout creation process.

Figure 4:
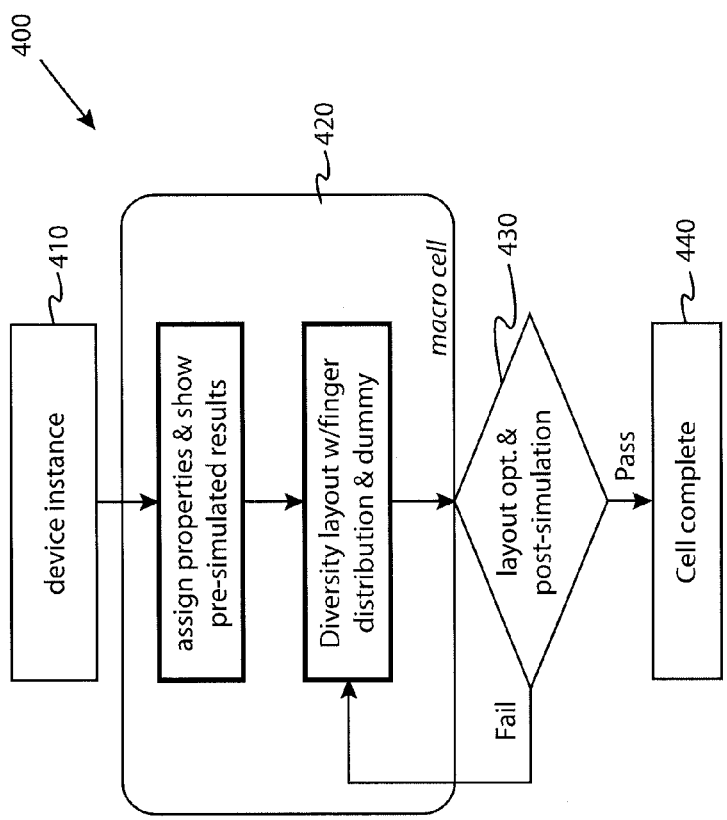
FIG. 4 is a simplified block diagram of a process design kit design flow according to one embodiment of the present subject matter.

FIG. 4 is a simplified block diagram of a PDK design flow according to various embodiments of the present subject matter. With reference to FIG. 3, an exemplary PDK method 400 includes at step 410 identifying a device or devices to be used and then performing a macro cell analysis 420. Included in this macro cell analysis 420 are various processes including, but not limited to, providing dynamic electrical characteristics (Id, Vtlin, Gm, Rout, etc.) without any simulation testbench, providing mismatch, density gradient, and LDE related parameter information in component description format (CDF), and assigning a coordinate index for array type devices (e.g., MOSFET) and determining individual LDE parameters. Also included in this macro cell analysis 420 are the estimation of layout density (PO/OD) information in a pre-simulation stage before layout creation whereby the macro cell can control layout density through CDF parameters. The macro cell analysis 420 can consider parasitics induced by device structures in the simulation phase to reduce any pre-simulation to post-simulation gap and create identical dummy insertions to resolve mismatch issues due to density gradient effect and edge effect. The macro cell analysis 420 can also provide high intelligence layout transformation which dynamically generates/monitors layout patterns, can support both pre-defined patterns and user edited patterns to create on-the-fly layout topologies, and can provide density-aware macro cell layouts to prevent design rule check (DRC) density rule violations. Additionally, an exemplary macro cell analysis 420 identifies coherent device properties between circuit simulation and layout creation and can provide an integrated design environment from the front-end circuit simulation to the back-end layout creation. Upon completion of this macro cell analysis 420, a post-layout simulation can be performed at step 430. Generally, this step can be performed on a post-layout simulator, such as HSPICE®, SPECTRE®, or another commercially-available post-layout simulators. If this post-layout simulation passes certain checks (e.g., DRCs, layout-versus-schematic (LVS) checks (e.g., layout versus schematic comparison), layout parasitic extraction (LPE) (e.g., a layout parameter extraction for MOS, resistor, capacitors, inductors, and/or other semiconductor devices), resistance and capacitance extraction (RCX) (e.g., interconnect parasitic resistance and capacitance extractions for timing simulations), and other verification steps of checks), then the cell is complete at step 440 and manufacturing can commence, else the designer proceeds back to step 420 and proceeds with additional macro cell analyses. It should be noted that the order of the steps described above in conjunction with FIG. 4 is merely exemplary and can be modified. For example, the performance of certain checks can be performed before the generation of a layout simulation. Further, in some embodiments, one or more steps can be added in the method 400, e.g., a step of performing a DRC can be performed after the generation of a design layout. Thus, the scope of the claims appended herewith should not be limited to the depicted order.

Several differences exist between the traditional PDK processes and embodiments of the present subject matter. For example, a traditional PDK process such as that depicted in FIG. 3 generally provides only a stand-alone device for a specific instance component rather than a macro cell instance component as described in embodiments of the present subject matter. These macro cell instance components are capable of providing interconnections between adjacent components. Further traditional PDK processes provide only fixed singular schematic symbols and do not support programmable symbols in contrast to embodiments of the present subject matter that provide a dynamic, adjustable and programmable symbol view. In the device layout of traditional PDK processes, separate layout density information is required and no intelligent checks are available for prospective layouts in contrast to the ability of embodiments of the present subject matter which provide common layout density information, provide a flexible layout style with gate distribution, provide for the capability of a dummy insert, and provide for the capability of an intelligent check against device patterns (e.g., source, drain, gate checks, etc.). Generally, traditional PDK processes do not provide an ability to create dummy patterns and array structures, do not provide support for PO/OD density information, and require a simulation test bench invoking commercial simulation tools as discussed above. Embodiments of the present subject matter, however, provide support for dummy patterns and intrinsic layouts, provide support for density gradient dummy patterns and other dummy structures, provide support for an array structure and automatically assign coordinate indices and provide a corresponding LDE determination, and also provide support for PO/OD density information with a tunable layout for density requirements. Thus, embodiments of the present subject matter can utilize dummy patterns to estimate and/or refine density gradients in exemplary wafers prior to simulation and manufacture. Further, through utilization of array devices, embodiments of the present subject matter can evaluate any impact of the array device on the surrounding environment to thereby assist in the determination of appropriate density information and assist in the passing of subsequent DRC checks. Further, in embodiments of the present subject matter, there is no need for a test bench in simulations of device performance.

Figure 5A:
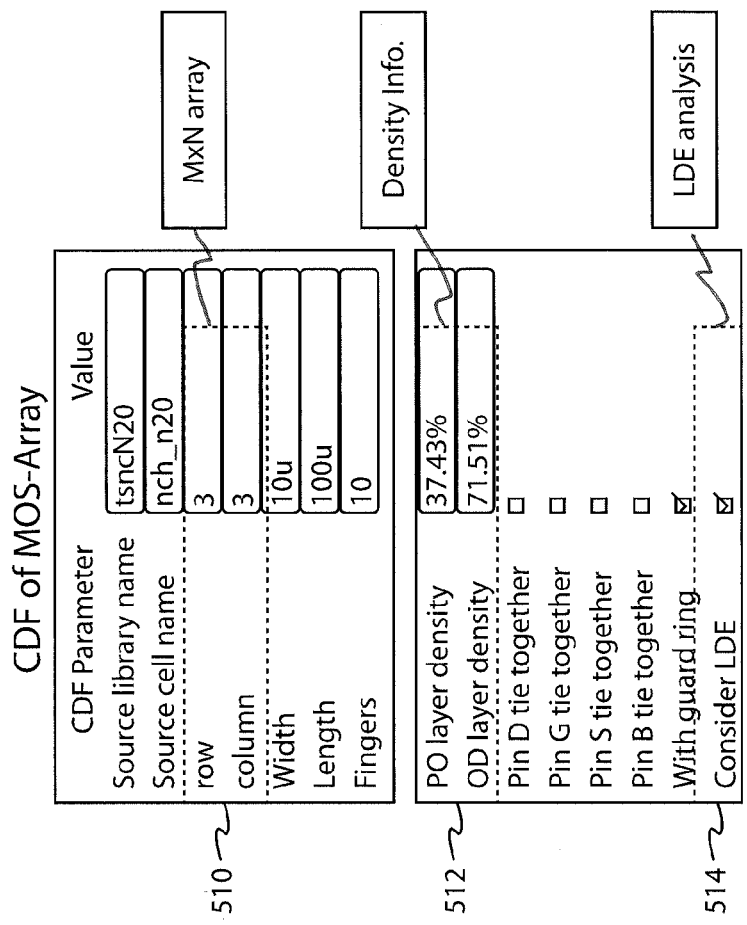

FIGS. 5A-5C are simplified diagrams of certain macro cell analyses in accordance with various embodiments of the present subject matter. With reference to FIGS. 5A-5C, an exemplary macro cell analysis step 420 depicted in FIG. 4 can generate a density gradient dummy pattern or identical dummy pattern for a macro cell. For example, FIG. 5A is a depiction of a CDF input step for a 20 nanometer (N20) process. As illustrated, an M×N MOS array 510 having three rows and three columns has been inputted by a designer resulting in density information 512 of a PO layer density of 37.43% and an OD layer density of 71.51%. In this depicted example, the designer has requested an LDE analysis 514 with a guard ring. It should be noted, however, that this example is for representational purposes only and should not limit the scope of the claims appended herewith as any number of columns and rows can be generated by a designer in such a prospective layout design. FIG. 5B provides symbolic and schematic illustrations of the MOS array of FIG. 5A. With reference to FIG. 5B, a symbolic MOS array 520 is provided having gate, drain, source and bulk terminals whereby some embodiments provide a schematic illustration for a 3×3 MOS array 524, a 2×2 MOS array, a 100×100 MOS array, etc. with appropriate coding indices. FIG. 5C is an illustration of a physical layout of the MOS array of FIGS. 5A and 5B. With reference to FIG. 5C, a physical layout 530 of a 3×3 MOS array is depicted with similar coding indices to that of the schematic illustration 524 in FIG. 5B. In this physical layout view of the macro cell, spacing information (dx, dy) 532 can be added between individual MOS devices as well as spacing 534 for the right, left, top and bottom array wells. Based upon this information, individual device LDE parameters (e.g., WPE, PSE, LOD, OSE, LPC, OP/PO Density, parasitics, mismatch, density, pre-coloring, etc.) can be determined and pre-simulated electrical performance can also be performed. Thus, generation of such a density-aware layout in embodiments of the present subject matter can prevent subsequent DRC density issues.

Figure 6:
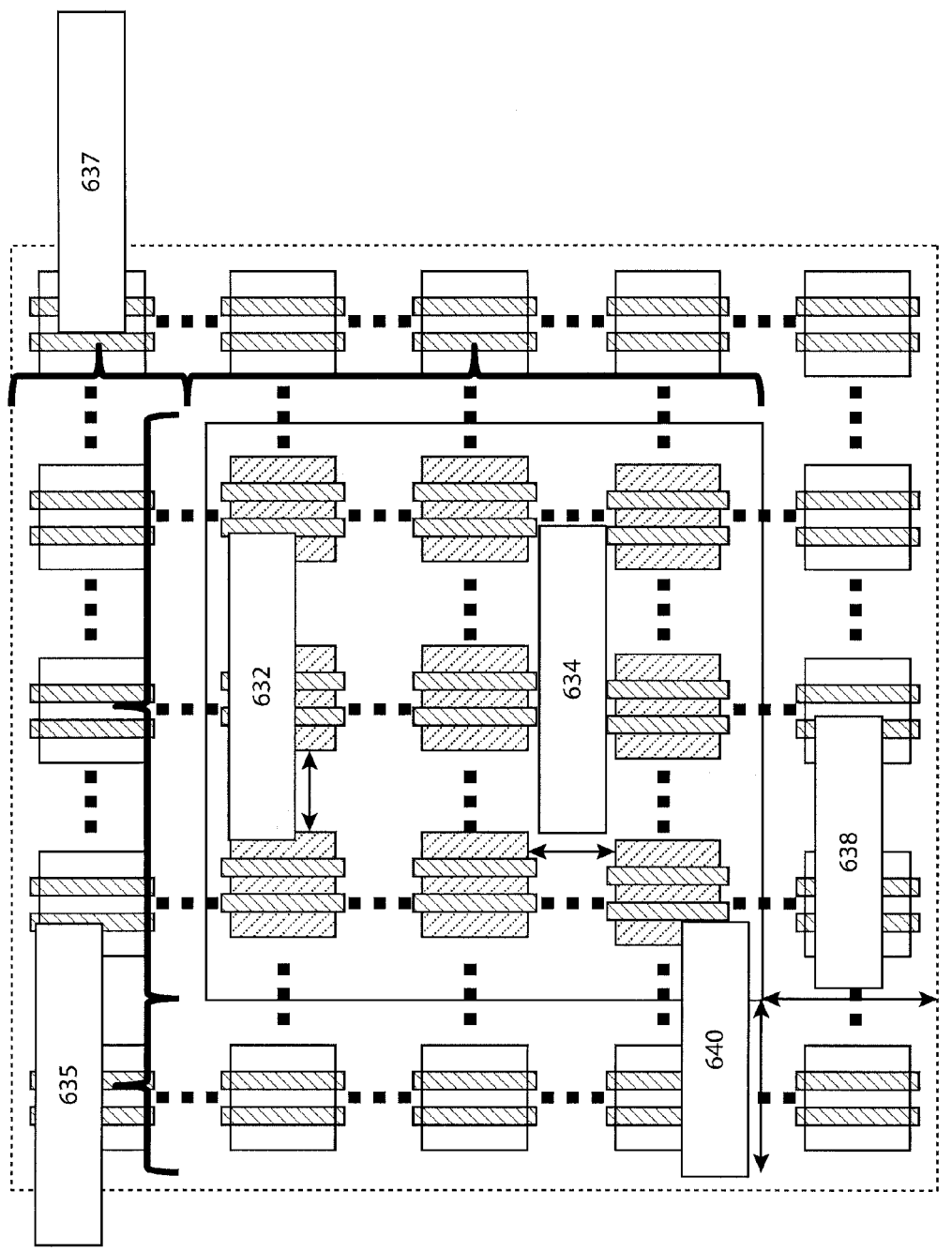
FIG. 6 is a simplified depiction of a dummy pattern for the metal-oxide-semiconductor array in FIGS. 5A-5C.

FIG. 6 is a simplified depiction of a dummy pattern for the MOS array in FIGS. 5A-5C. With reference to FIG. 6, an exemplary dummy pattern 600 can mimic the M×N array provided in earlier layout and design steps to include appropriate x-direction 632 and y-direction 634 OD to OD spacing, an identical number of dummy cells in the x-direction and y-direction 635, 637, a matching height and width 638, 640, and matching core types (normal, medium, high) for density purposes. This provides a designer with an ability to control MA density and control an identical dummy insertion if necessary. Further, a designer can create a matching flag in a respective model database for later use of macro device densities as needed.

Figure 7A:
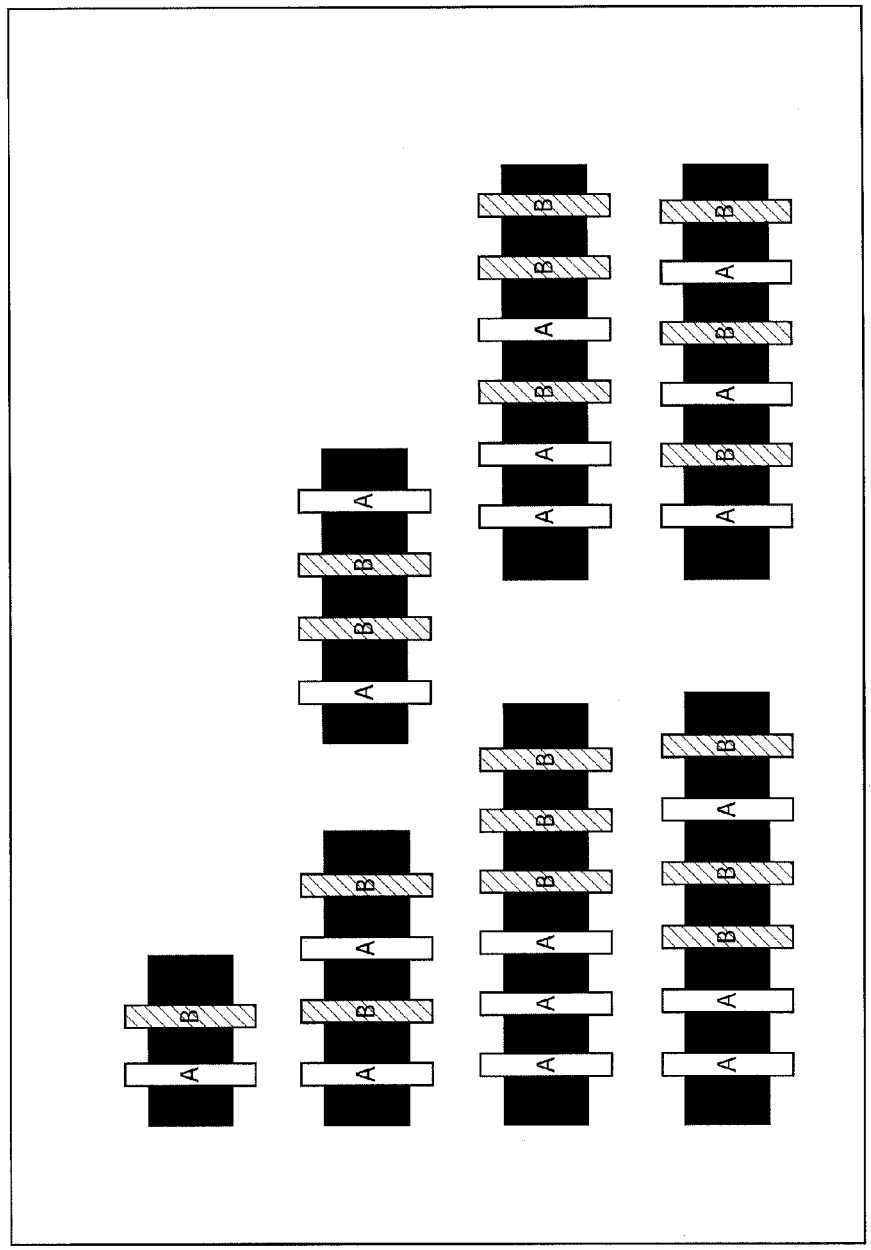
FIGS. 7A-7C are graphical illustrations of an intelligent check process according to an embodiment of the present subject matter.
Figure 7C:
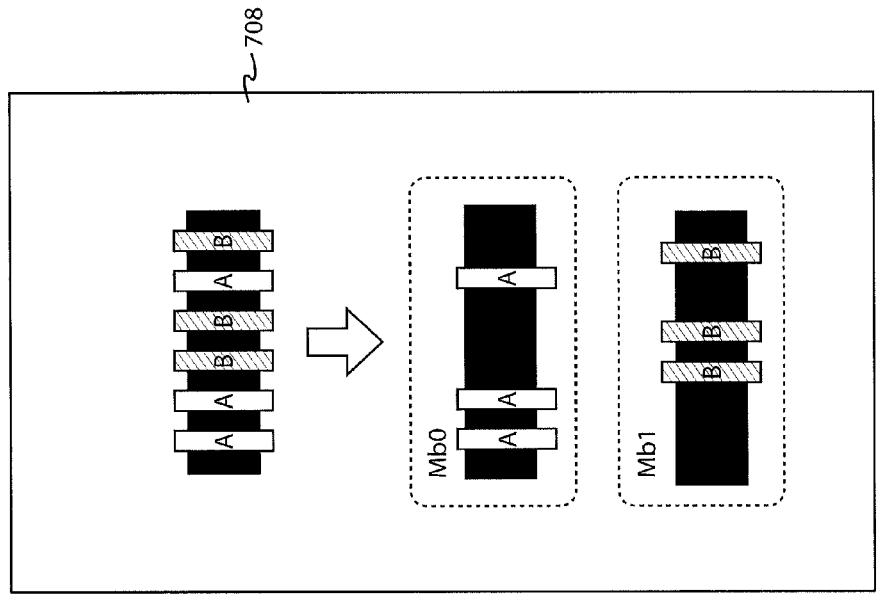
Figure 7B:
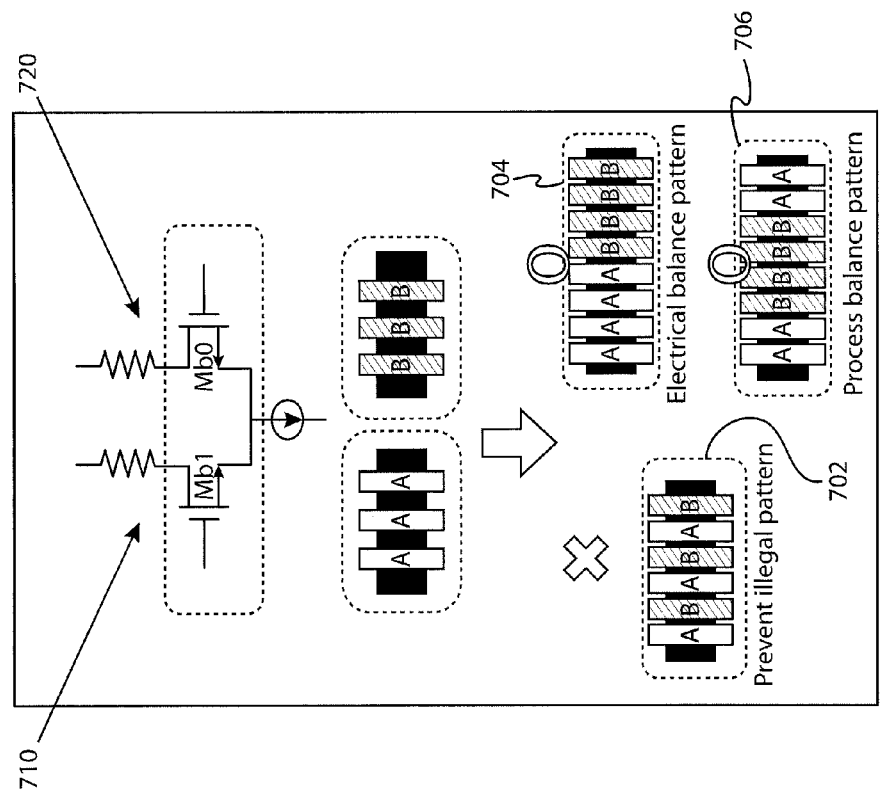

FIGS. 7A-7C are graphical illustrations of an intelligent check process according to various embodiments of the present subject matter. With reference to FIGS. 7A-7C, an intelligent check process can employ an intelligent layout transformation to exclude improper patterns between adjacent devices. For example, using transistor A and transistor B, FIG. 7A illustrates that one cannot arbitrarily distribute the fingers of these transistors between the other; rather, the distribution must follow some set of rules between source, drain, gate, and bulk terminals and such a distribution can be defined for an exemplary macro cell combining transistor A and transistor B. Thus, for a first MOS 710 and a second MOS 720 depicted in FIG. 7B, using an exemplary macro cell analysis, appropriate rules can be implemented and any improper or incorrect electrical pattern 702 between source, gate and drain terminals of the MOS devices 710, 720 can be identified and/or prevented. Rather, a balanced electrical pattern 704 can be provided/confirmed or a balanced process pattern 706 provided/confirmed to a customer as will be discussed with reference to FIGS. 8A-8B. It is therefore an aspect of certain embodiments that a multiple-OD MOS device can be transformed into one shared-OD MOS device, and a pre-simulated electrical performance with mismatch analysis and LDE impact performed upon an exemplary pattern 708 as depicted in FIG. 7C.

Figure 8B:
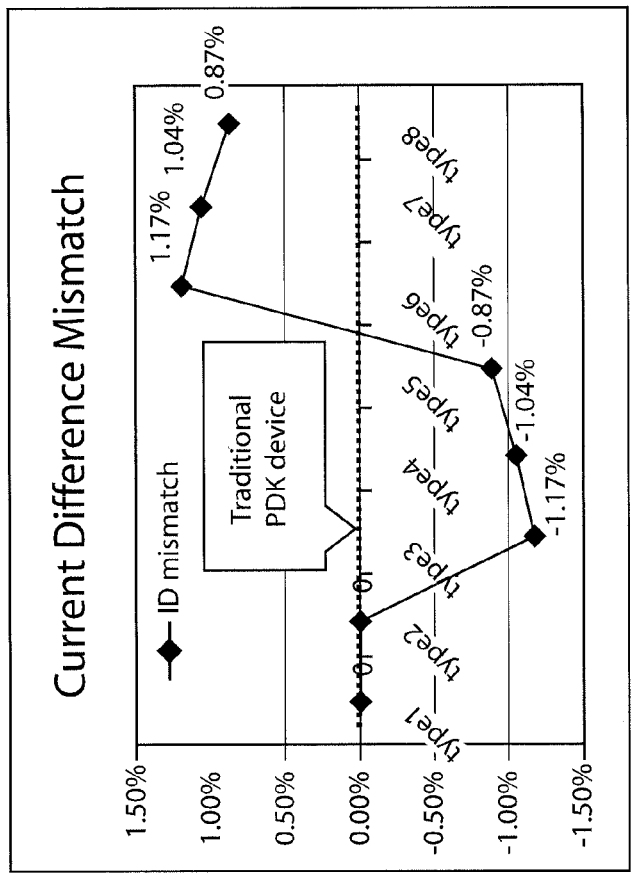
FIGS. 8A-8B are illustrations of a layout distribution process according to one embodiment of the present subject matter.
Figure 8A:
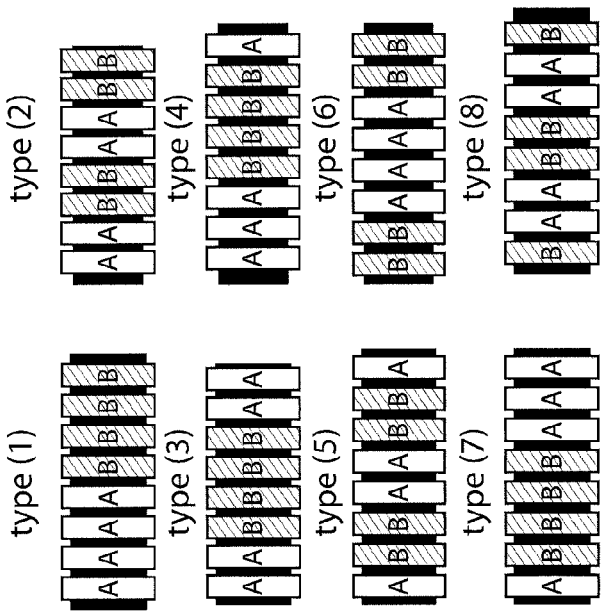

FIGS. 8A-8B are illustrations of a layout distribution process according to various embodiments of the present subject matter. With reference to FIG. 8A, an intelligent layout transformation process described above has provided eight types or patterns 810 of macro cells types (1) through (8) for a transistor A and a transistor B. Each of these patterns, however, do not possess the same electrical performance. For example, FIG. 8B is a plot of electrical performance for each of the respective macro cell types depicted in FIG. 8A. With reference to FIG. 8B, macro cell types (1) and (2) possess a zero percent current difference (ID) whereas each of types (3) through (8) possess current mismatches ranging from a −1.17% current mismatch for type (3), to a −1.04% current mismatch for type (4), a −0.87% current mismatch for type (5), a +1.17% current mismatch for type (6), a +1.04% current mismatch for type (7), and a +0.87% current mismatch for type (8). Thus, to prevent current mismatch in the design of a layout, an exemplary layout distribution process can determine current mismatches between macro cell structures in a proposed layout, unlike traditional PDK processes which provide no support for dynamic gate distribution and thus are unaware of mismatching between devices. Furthermore, even though eight macro cell types were identified as proper in FIG. 8A, the second level of intelligent checking and layout distribution depicted in FIG. 8B can be employed to further optimize a prospective design layout.

Figure 9A:
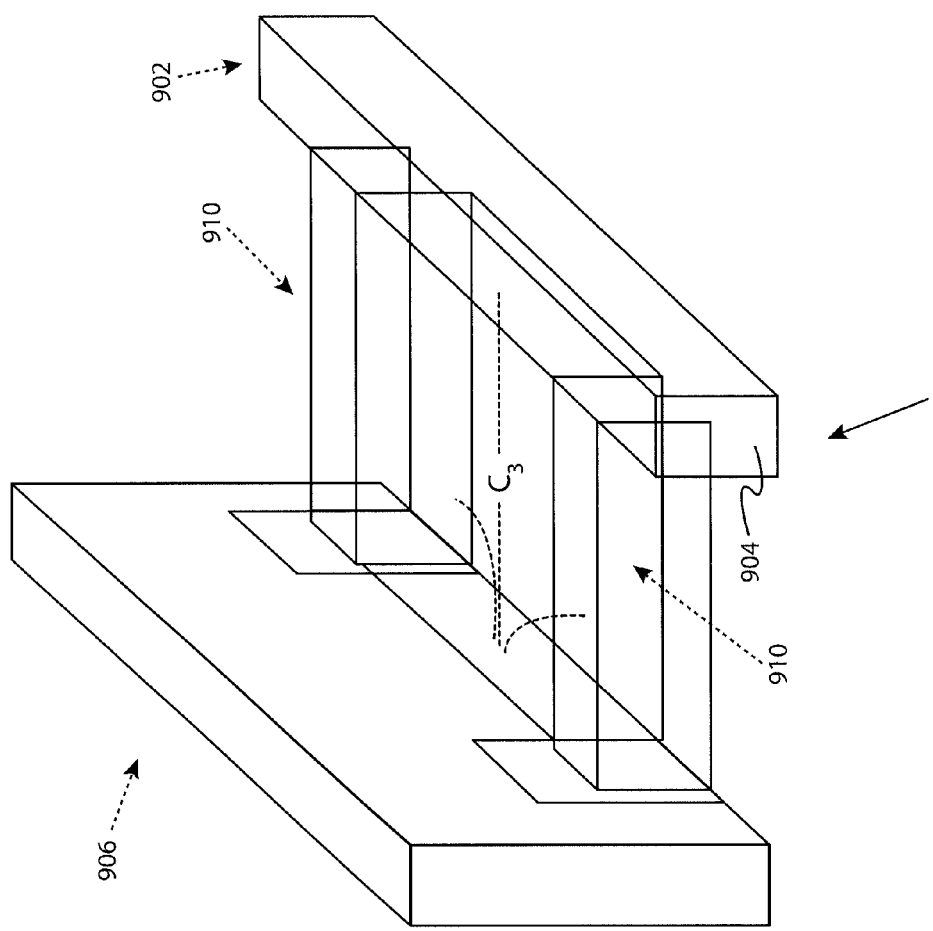
FIG. 9A is a simplified diagram of a FinFET.
Figure 9B:
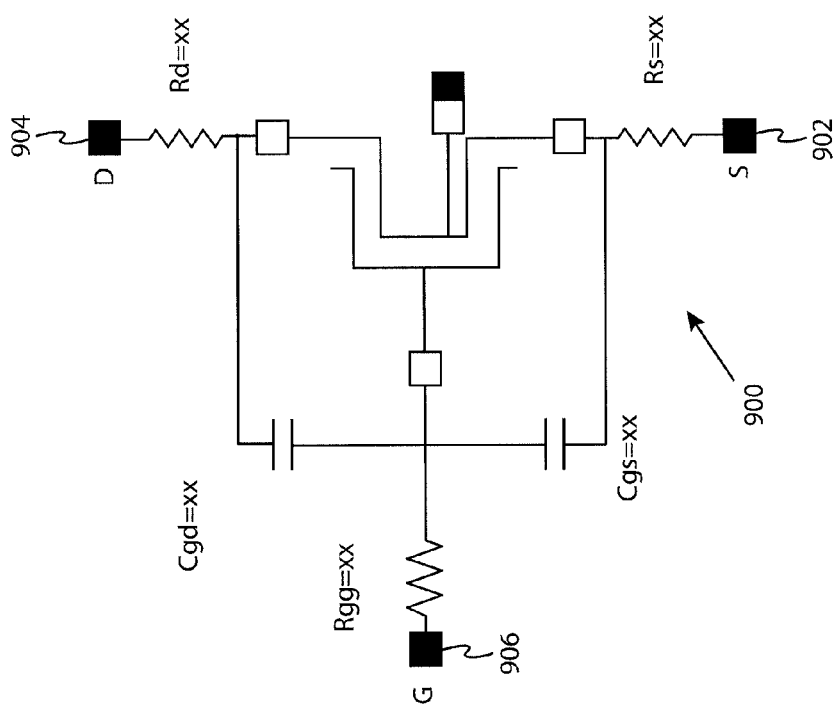
FIGS. 9B and 9C are a schematic diagram and layout view, respectively, of the FinFET of FIG. 9A.
Figure 9C:
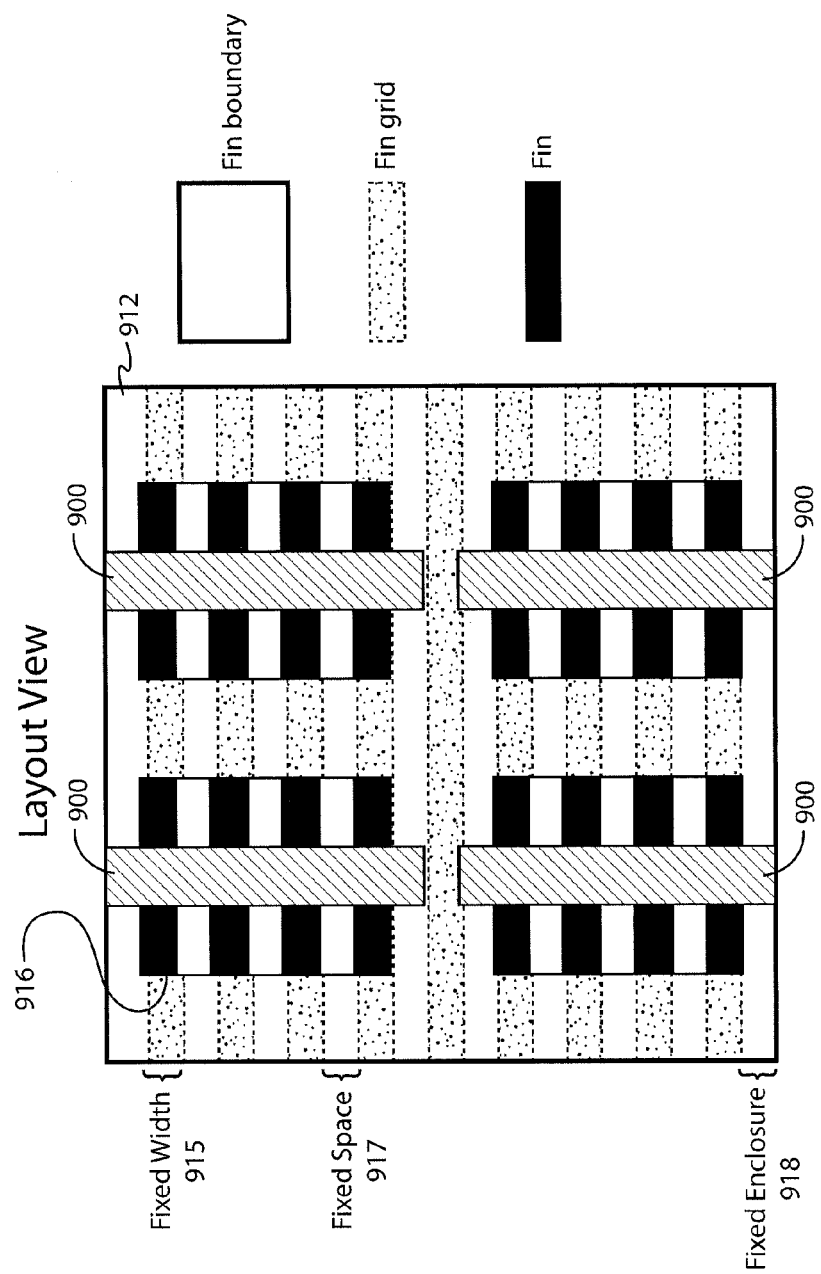

While the figures heretofore have described embodiments of the present subject matter as they relate to MOS devices, the claims appended herewith should not be so limited as the IC evaluated and/or designed cart be a digital circuit, an analog circuit, a mixed-signal circuit, a static random access memory (SRAM) circuit, an embedded SRAM circuit, a dynamic random access memory (DRAM) circuit, an embedded DRAM circuit, a non-volatile memory circuit, e.g., FLASH, EPROM, E2PROME, a field-programmable gate circuit, a FinFET device, or any suitable IC or other restricted or discrete device. For example, FIG. 9A is a simplified diagram of a FinFET, and FIGS. 9B and 9C are a schematic diagram and layout view, respectively, of the FinFET of FIG.

9A. With reference to FIGS. 9A-9C, a FinFET 900 is generally a nonplanar, double-gate transistor built on a substrate based upon a single-gate transistor design. The FinFET 900 includes source, drain and gate terminals 902, 904, 906 and includes a conducting channel wrapped by a thin silicon fin 910 which forms the body of the device. Using embodiments of the present subject matter, an array of FinFETs 900 depicted in FIG. 9A can be included in an exemplary layout and the processing heretofore performed on the array. For example, a fin boundary 912 can be defined whereby a tin grid or pattern 914 is generated having a plurality of fins 916 with fixed widths 915 and fixed spaces 917 therebetween. Included in the layout can be a fixed enclosure 918 having a predetermined width surrounding the one or more FinFETs 900. In some embodiments, this layout is a dummy layout as described above. Using embodiments of the present subject matter, a pre-simulated macro cell can be applied to these FinFET devices and any front-end-of-line (FEOL) or mid-end-of-line (MEOL) parasitics induced by the FinFET device can be covered in the pre-simulation stage to reduce any pre-simulation to post-simulation gaps. Further, any LDE effects of the FinFETs 900 inside the fin boundary 912 can be considered and determined employing exemplary processes described above from the top-level CDF form depicted in FIG. 5A (e.g., dummy patterns, intelligent check processes, layout distribution processes, and other macro cell analyses).

Figure 10:
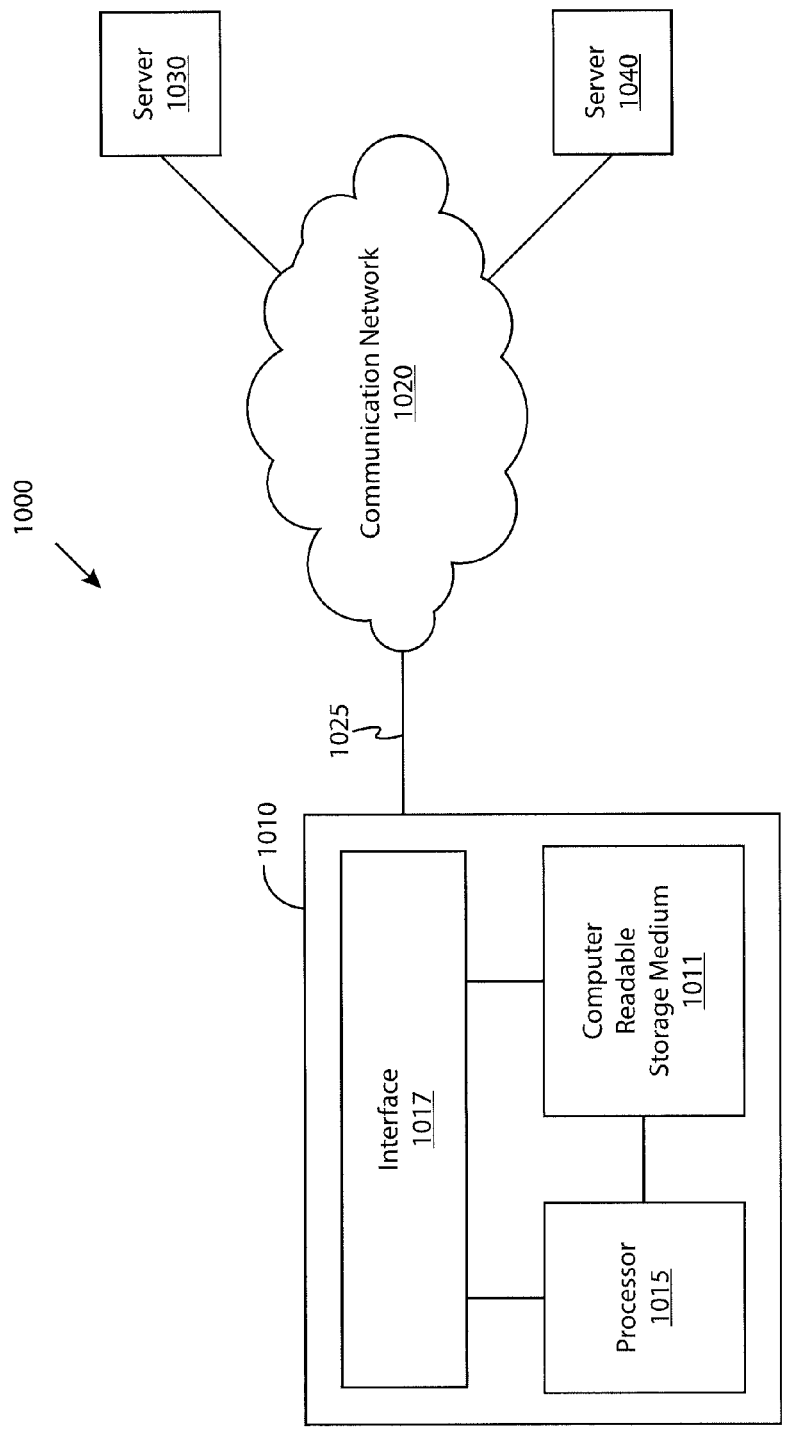
FIG. 10 is a schematic drawing illustrating an exemplary network system.

FIG. 10 is a schematic drawing illustrating an exemplary network system. With reference to FIG. 10, an exemplary network system 1000 can include a computer system 1010 coupled with servers 1030 and 1040 through a communication network 1020. In some embodiments, the computer system 1010 can include a computer readable storage medium 1011 encoded with computer program code. The computer system 1010 can include a processor 1015 electrically coupled with the computer readable storage medium 1011. The processor 1015 can be configured to execute the computer program code for designing ICs. The processor 1015 can be a central processing unit (CPU), a multi-processor, a distributed processing system, and/or any suitable processing unit. In some embodiments, the processor 1015 can be configured to perform a pre-layout or post-layout simulation of an IC. The pre-layout simulation can be performed using a netlist or IP generated from a PDK file. The PDK file can include a plurality of device model cards assigned to a plurality of devices. For example, the devices can include an N-type MOSFET (NMOS), a P-type MOSFET (PMOS), a double-diffused MOS (DMOS) transistor, a complementary MOS (CMOS) transistor, a p/n junction diode, a resistor, a capacitor, an inductor, a bipolar transistor, a high-voltage (HV) device, a device formed by a HV Bipolar-CMOS-DMOS (HV BCD) process, and/or other semiconductor devices. The device model cards can include various dimensional parameters, device models, terminals, and/or other electrical parameters. The dimensional parameters can include at least one of length, width, depth, thickness, area, perimeter, and/or other spatial parameters of each device. The processor 1015 can be further configured to generate a design layout of the IC corresponding to a result of the pre-layout simulation. The processor 1015 can also be configured to perform a post-layout simulation and/or any respective layout checks.

In some embodiments, the computer readable storage medium 1011 can be an electronic, magnetic, optical, electromagnetic, infrared, a semiconductor system (or apparatus or device), and/or a propagation medium. For example, the computer readable storage medium 1011 can include a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1011 can include a compact disk-read only memory (CD-ROM), a compact disk-read/write (CD-R/W), and/or a digital video disc (DVD). In some embodiments, the computer program code stored in the computer readable storage medium 1011 can include at least one software and/or circuit related data such as PDK files, netlists, electronic design automation (EDA) tools, LPE technology files, RC technology files, device models, post-layout simulators, pre-layout simulator, and/or any other software or data that are used for designing ICs. In some embodiments, the software can be stored in the servers 1030 and 1040 and accessed through the communication network 1020. For example, the computer system 1010 can be electrically coupled with the communications network 1020 through a wireless and/or Tired link 1025. The communication network 1020 can be, for example, a complete network, a subnet of a local area network, a company-wide intranet, and/or the Internet. The computer system 1010 can be identified on the communication network 1020 by an address or a combination of addresses, such as a media access control (MAC) address associated with a network interface 1017 and an internet protocol (IP) address. The network interface 1017 can be, for example, a modem, a wireless transceiver, and/or one or more network interface cards (NICs).

In some embodiments, the computer system 1010 includes a computer readable storage medium 1011 being encoded with computer program code, and a processor 1015 electrically coupled with the computer readable storage medium 1011. The processor 1015 can be configured to execute the computer program code for designing an IC and can be arranged to cause the processor 1015 to select a plurality of devices, assign properties to each of the plurality of devices, combine the plurality of devices into a macro cell, and generate a density gradient pattern for the macro cell. These devices can be, but are not limited to, MOS transistors, FinFETs, restricted devices, NMOS and/or PMOS devices, DMOS transistors, CMOS transistors, p/n junction diodes, resistors, capacitors, inductors, bipolar transistors, HV devices, devices formed by HV BCD processes, and combinations thereof. Further, the assigned properties can be, but are not limited to number of rows, number of columns, array well dimensions, device dimensions, resistance values, capacitance values, inductance values, current difference, voltage values, current values, and combinations thereof. The processor 1015 can also be arranged or configured to determine LDE parameters for the macro cell as a function of the combination of plurality of devices, simulate electrical performance characteristics for the macro cell, determine a layout distribution of the plurality of devices within the macro cell as a function of one or more of the simulated electrical performance characteristics, determined LDE parameters, and generated density gradient pattern, and generate a design layout of an integrated circuit corresponding to the layout distribution for the macro cell. The LDE parameters can be, but are not limited to, WPE, PSE, LOD, OSE, LPC, OP/PO Density, parasitics, mismatch, density, pre-coloring, and combinations thereof.

In some embodiments, the processor 1015 is further configured to perform a post-layout simulation of the generated design layout. In such an embodiment, the processor can also be configured to perform DRCs such as, but not limited to, LVS checks, LPE, RCX, and combinations thereof. In some embodiments, the processor 1015 is configured to generate and adjust PDK device symbols. In some embodiments, the processor 1015 is configured to provide interconnections between the plurality of devices and provide additional devices having parasitic capacitances, parasitic resistances, parasitic inductances, or other parasitic effects. In some embodiments, the processor 1015 is configured to provide a coordinate index for devices within the macro cell, provide a guard ring surrounding the devices within the macro cell, provide x and y dimension spacing between devices within the macro cell, or provide gate finger distributions between devices within the macro cell. In some embodiments, the processor 1015 is configured to perform a mismatch analysis between terminals of devices within the macro cell, to exclude incorrect patterns of devices within the macro cell as a function of the properties assigned to each of the devices, and/or to generate a density gradient dummy pattern or identical dummy pattern.

Figure 11:
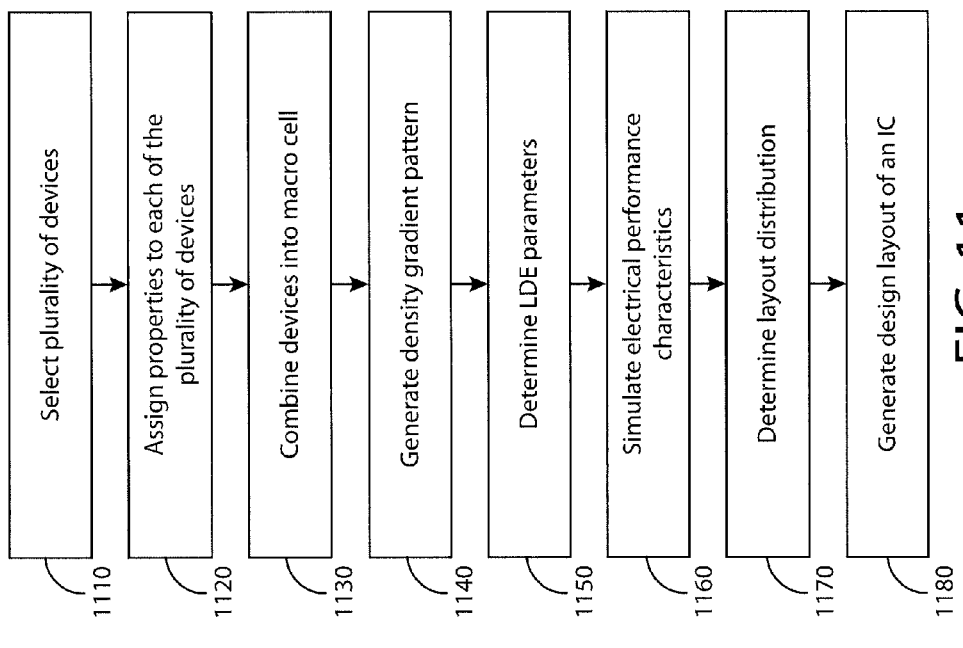
FIG. 11 is a block diagram of one embodiment of the present subject matter.

FIG. 11 is a block diagram of a method 1100 of designing an IC in accordance with various embodiments of the present disclosure. At step 1110, the method includes selecting a plurality of devices and at step 1120 assigning properties to each of the plurality of devices. In some embodiments, step 1110 can include generating and adjusting PDK device symbols. These devices can be, but are not limited to, MOS transistors, FinFETs, restricted devices, NMOS and/or PMOS devices, DMOS transistors, CMOS transistors, p/n junction diodes, resistors, capacitors, inductors, bipolar transistors, HV devices, devices formed by HV BCD processes, and combinations thereof. Further, the assigned properties can be, but are not limited to number of rows, number of columns, array well dimensions, device dimensions, resistance values, capacitance values, inductance values, current difference, voltage values, current values, and combinations thereof. At step 1130, the plurality of devices having assigned properties can be combined into a macro cell and a density gradient pattern generated for the macro cell at step 1140. In some embodiments, step 1130 can include providing interconnections between the plurality of devices and providing additional devices having parasitic capacitances, parasitic resistances, parasitic inductances, or other parasitic effects. In some embodiments, step 1130 can include providing a coordinate index for devices within the macro cell, providing a guard ring surrounding the devices within the macro cell, providing x and y dimension spacing between devices within the macro cell, providing gate finger distributions between devices within the macro cell, and combinations thereof. In some embodiments, step 1140 includes generating a density gradient dummy pattern or identical dummy pattern.

LDE parameters can then be determined for the macro cell as a function of the combination of plural devices at step 1150 and electrical performance characteristics simulated for the macro cell at step 1160. The LDE parameters can be, but are not limited to, WPE, PSE, LOD, OSE, LPC, OP/PO Density, parasitics, mismatch, density, pre-coloring, and combinations thereof. At step 1170, a layout distribution of the plurality of devices within the macro cell can be determined as a function of one or more of the simulated electrical performance characteristics, determined LDE parameters, and generated density gradient pattern. In some embodiments, step 1170 includes performing a mismatch analysis between terminals of devices within the macro cell and/or excluding incorrect patterns of devices within the macro cell as a function of the properties assigned to each of the devices. Then at step 1180, a design layout of an IC can be generated corresponding to the layout distribution for the macro cell. In some embodiments the method includes the step of performing a post-layout simulation of the generated design layout. In such embodiments, the method can include performing DRCs such as, but not limited to, LVS checks, LPE, RCX, and combinations thereof.

FIG. 12 is a block diagram of a method 1200 of designing an IC in accordance with various embodiments of the present disclosure. The method 1200 includes determining an intelligent layout distribution of individual devices within a macro cell as a function of one or more of electrical performance characteristics of the macro cell, LDE parameters of the macro cell, and a density gradient pattern of the macro cell at step 1210. These devices can be, but are not limited to, MOS transistors, FinFETs, restricted devices, NMOS and/or PMOS devices, DMOS transistors, CMOS transistors, p/n junction diodes, resistors, capacitors, inductors, bipolar transistors, HV devices, devices formed by HV BCD processes, and combinations thereof. Step 1210 includes performing a mismatch analysis between terminals of individual devices within the macro cell whereby incorrect patterns of the individual devices within the macro cell are excluded as a function of the properties assigned to each of the devices. Further, the LDE parameters can be, but are not limited to, WPE, PSE, LOD, OSE, LPC, OP/PO Density, parasitics, mismatch, density, pre-coloring, and combinations thereof. At step 1220, a design layout of an IC can be generated corresponding to the intelligent layout distribution for the macro cell. In some embodiments the method includes the step of performing a post-layout simulation of the generated design layout. In such embodiments, the method can include performing DRCs such as, but not limited to, LVS checks, LPE, RCX, and combinations thereof.

It is therefore an aspect of embodiments of the present subject matter to provide a simulator-embedded PDK to allow simulation of a macro cell and any associated complex effects possible. Such exemplary macro cells take advantage of the integration of multiple devices therein and determine solutions to complex problems such as parasitics (e.g., the determination of parasitic effects in the designed devices and wiring interconnects), mismatch between devices, density issues and pre-coloring issues. It is also an aspect of embodiments to provide dynamic electrical characteristics without a simulation test-bench, provide mismatch, density gradient, and LDE related parameter information in CDF, assign a coordinate index for array type devices and determine individual LDE parameters. Another aspect of embodiments includes estimation of layout density information in a pre-simulation stage before layout creation, consideration of parasitics induced by device structures in the simulation phase to reduce any pre-simulation to post-simulation gap, and creation of identical dummy insertions to resolve mismatch issues due to density gradient effect and edge effect. Further aspects of embodiments include the provision of a high intelligence layout transformation which dynamically generates/monitors layout patterns, supports pre-defined patterns and user edited patterns, and provides density-aware macro cell layouts to prevent DRC density rule violations. Further aspects include identifying coherent device properties between circuit simulation and layout creation and providing an integrated design environment from front-end circuit simulation to back-end layout creation.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-12, a macro cell based PDK for advanced applications have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A method of designing an integrated circuit comprising the steps of:
   selecting a plurality of devices;
   assigning, using a computer, properties to each of the plurality of devices;
   combining the plurality of devices having assigned properties into a macro cell;
   generating a density gradient pattern for the macro cell;
   determining layout dependent effect (LDE) parameters for the macro cell as a function of the combination of plural devices;
   simulating electrical performance characteristics for the macro cell;
   determining a layout distribution of the plurality of devices within the macro cell as a function of one or more of the simulated electrical performance characteristics, determined LDE parameters, and generated density gradient pattern; and
   generating a design layout of an integrated circuit corresponding to the layout distribution for the macro cell.

2. The method of claim 1 further comprising the step of performing a post-layout simulation of the generated design layout.

3. The method of claim 1 wherein the step of selecting a plurality of individual devices further comprises generating and adjusting process design kit device symbols.

4. The method of claim 1 wherein the step of combining the plurality of devices into a macro cell further comprises providing interconnections between the plurality of devices and providing additional devices having parasitic capacitances, parasitic resistances, parasitic inductances, or other parasitic effects.

5. The method of claim 1 wherein the step of combining the plurality of devices into a macro cell further comprises a step selected from the group consisting of providing a coordinate index for devices within the macro cell, providing a guard ring surrounding the devices within the macro cell, providing x and y dimension spacing between devices within the macro cell, providing gate finger distributions between devices within the macro cell, and combinations thereof.

6. The method of claim 1 wherein the step of determining a layout distribution further comprises performing a mismatch analysis between terminals of devices within the macro cell.

7. The method of claim 1 wherein the step of determining a layout distribution further comprises excluding incorrect patterns of devices within the macro cell as a function of the properties assigned to each of the devices.

8. The method of claim 1 wherein the devices are selected from the group consisting of a metal-oxide-semiconductor (MOS) transistor, a FinFET, a restricted device, a N-type MOS field effect transistor (NMOS), a P-type MOSFET (PMOS), a double-diffused MOS (DMOS) transistor, a complementary MOS (CMOS) transistor, a p/n junction diode, a resistor, a capacitor, an inductor, a bipolar transistor, a high-voltage (HV) device, a device formed by a HV Bipolar-CMOS-DMOS (HV BCD) process, and combinations thereof.

9. The method of claim 1 wherein the step of generating a density gradient pattern further comprises generating a density gradient dummy pattern or identical dummy pattern.

10. The method of claim 1 wherein the LDE parameters are selected from the group consisting of well proximity effects (WPE), poly-spacing effects (PSE), length of diffusion (LOD), OD to OD spacing effects (OSE), layout patterning check (LPC), OD poly density (OP/PO Density), parasitics, mismatch, density, pre-coloring, and combinations thereof.

11. The method of claim 1 wherein the assigned properties are selected from the group consisting of number of rows, number of columns, array well dimensions, device dimensions, resistance values, capacitance values, inductance values, current difference, voltage values, current values, and combinations thereof.

12. The method of claim 1 wherein the step of combining the plurality of devices into a macro cell further comprises providing interconnections between the plurality of devices.

13. The method of claim 1 wherein the step of combining the plurality of devices into a macro cell further comprises providing gate finger distributions between devices within the macro cell.

14. The method of claim 1 wherein the step of combining the plurality of devices into a macro cell further comprises providing x and y dimension spacing between devices within the macro cell.

15. The method of claim 1 wherein the step of generating a density gradient pattern further comprises generating a density gradient dummy pattern.

16. A method of designing an integrated circuit comprising the steps of:
   selecting a plurality of devices;
   assigning, using a computer, properties to each of the plurality of devices;
   combining the plurality of devices having assigned properties into a macro cell;
   generating a density gradient pattern for the macro cell or a set of dummy patterns surrounding the macro cell;
   determining layout dependent effect (LDE) parameters for the macro cell based on the combination of the plurality of devices;
   simulating electrical performance characteristics for the macro cell;
   determining a layout distribution of the plurality of devices within the macro cell based on one or more of the simulated electrical performance characteristics, determined LDE parameters, and generated density gradient pattern or set of dummy patterns surrounding the macro cell; and generating a design layout of an integrated circuit corresponding to the layout distribution for the macro cell.

17. The method of claim 16, wherein the steps of simulating electrical performance characteristics for the macro cell and determining the layout distribution of the plurality of devices within the macro cell are performed before generating the design layout.

18. The method of claim 16, wherein the step of combining the plurality of devices into the macro cell comprises a step selected from the group consisting of providing a coordinate index for devices within the macro cell, providing a guard ring surrounding the devices within the macro cell, providing x and y dimension spacing between devices within the macro cell, providing gate finger distributions between devices within the macro cell, and combinations thereof.

19. The method of claim 16, wherein the assigned properties are selected from the group consisting of number of rows, number of columns, array well dimensions, device dimensions, resistance values, capacitance values, inductance values, current difference, voltage values, current values, and combinations thereof.

20. A method of designing an integrated circuit comprising the steps of:

(a) selecting a plurality of devices;

(b) assigning, using a computer, properties to each of the plurality of devices;

(c) combining the plurality of devices having assigned properties into a macro cell, including a step selected from the group consisting of providing a coordinate index for devices within the macro cell, providing a guard ring surrounding the devices within the macro cell, providing x and y dimension spacing between devices within the macro cell, providing gate finger distributions between devices within the macro cell, and combinations thereof;

(d) generating a density gradient pattern for the macro cell or a set of dummy patterns surrounding the macro cell;

(e) determining layout dependent effect (LDE) parameters for the macro cell based on the combination of the plurality of devices;

(f) simulating electrical performance characteristics for the macro cell;

(g) determining a layout distribution of the plurality of devices within the macro cell based on one or more of the simulated electrical performance characteristics, determined LDE parameters, and generated density gradient pattern or set of dummy patterns surrounding the macro cell; and (h) generating a design layout of an integrated circuit corresponding to the layout distribution for the macro cell after steps (a) through (g) are performed.

\* \* \* \* \*